United States Patent
Ishizuka et al.

(10) Patent No.: US 6,617,529 B2
(45) Date of Patent: Sep. 9, 2003

(54) CIRCUIT BOARD AND ELECTRONIC EQUIPMENT USING THE SAME

(75) Inventors: Naomi Ishizuka, Tokyo (JP); Akihito Matsumoto, Tokyo (JP); Eiichi Kono, Tokyo (JP); Motoji Suzuki, Tokyo (JP); Akihiro Sato, Tokyo (JP); Hiroshi Matsuoka, Tokyo (JP); Masafumi Kanai, Shizuoka (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/985,727

(22) Filed: Nov. 6, 2001

(65) Prior Publication Data
US 2002/0074164 A1 Jun. 20, 2002

(30) Foreign Application Priority Data
Dec. 19, 2000 (JP) .......................... 2000-384964
Oct. 19, 2001 (JP) .......................... 2001-322463

(51) Int. Cl.⁷ ........................... H01R 12/04; H05K 1/11
(52) U.S. Cl. ................... 174/266; 174/260; 174/261; 174/262; 174/263; 361/760; 361/767; 361/779
(58) Field of Search .................. 174/263, 260, 174/266, 261, 262; 361/761, 760, 803, 807, 779, 767, 792, 793; 257/734, 735; 439/876

(56) References Cited

U.S. PATENT DOCUMENTS 3,541,225 A * 11/1970 Raciti ...................... 174/126.1
3,953,664 A * 4/1976 Tsunashima ................. 174/264
4,610,756 A * 9/1986 Strobel ........................ 174/257
4,761,881 A * 8/1988 Bora et al. ................ 228/180.1
5,373,985 A * 12/1994 Chiba et al. ............. 228/180.1
5,730,932 A * 3/1998 Sarkhel et al. ........... 228/180.1

FOREIGN PATENT DOCUMENTS

| JP | 408125303 A | * | 5/1996 |
| JP | 408181424 A | * | 7/1996 |
| JP | 409277082 A | * | 10/1997 |
| JP | 10-126026 | | 5/1998 |

OTHER PUBLICATIONS

Kanai et al., "Fillet and Land Lifting Phenomenon on Lead-Free Solder", *MES2000*, The Tenth Microelectronics Symposium, Nov. 2000, pp. 207–210.

* cited by examiner

Primary Examiner—Kamand Cuneo
Assistant Examiner—I. B. Patel
(74) Attorney, Agent, or Firm—Sughrue Mion, PLLC (57) ABSTRACT

In a circuit board having lands 2 each of which has a through hole 4 through which a lead of an electrical part is inserted, the lead 3 and the land 2 being mounted in the circuit board by using lead-free solder 6, the width of the land 2 corresponding to the difference in radius between the land 2 and the through hole 4 is set to about 0.40 mm or more. The width of the land 2 is set to such a value that the land exfoliation due to the solidification/shrinkage of the lead-free solder 6 and the shrinkage of the circuit board in the thickness direction can be prevented. The circuit board 1 has circuit wires at least on both the surface and the back surface.

7 Claims, 9 Drawing Sheets

FIG.1 PRIOR ART

LAND WIDTH : SMALL
LAND AREA, RADIUS : SMALL
LAND DIAMETER : SMALL

FIG.2 PRIOR ART

ANGLE : LARGE
LAND WIDTH : SMALL
LAND AREA, RADIUS : SMALL
LAND DIAMETER : SMALL

LAND WIDTH : LARGE
LAND AREA, RADIUS : LARGE
LAND DIAMETER : LARGE

FIG.8

ANGLE : SMALL
LAND WIDTH : LARGE
LAND AREA, RADIUS : LARGE
LAND DIAMETER : LARGE

FIG.9
(LAND DIAMETER Y : EXAMPLE, LAND DIAMETER X : COMPARISON EXAMPLE)

| EXAMPLE COMPARISON EXAMPLE | THROUGH HOLE DIAMETER Z(mm) | LAND DIAMETER X (mm) | LAND DIAMETER Y (mm) | X LAND WIDTH (X−Z)/2 | Y LAND WIDTH (X−Y)/2 | INCIDENCE OF X LAND EXFOLIATION(%) | INCIDENCE OF Y LAND EXFOLIATION(%) |
|---|---|---|---|---|---|---|---|
| EXAMPLE 1 COMPARISON EXAMPLE 1 | 0.6 | 1.1 | 1.4 | 0.25 | 0.4 | 31.3 | 0 |
| EXAMPLE 2 COMPARISON EXAMPLE 2 | 0.8 | 1.3 | 1.6 | 0.25 | 0.4 | 21 | 4 |
| EXAMPLE 3 COMPARISON EXAMPLE 3 | 0.9 | 1.35 | 1.7 | 0.225 | 0.4 | 25 | 0 |
| EXAMPLE 4 COMPARISON EXAMPLE 4 | 0.9 | 1.35 | 1.7 | 0.225 | 0.4 | 69.2 | 0 |
| EXAMPLE 5 COMPARISON EXAMPLE 5 | 1 | 1.6 | 1.9 | 0.3 | 0.45 | 33 | 0 |
| EXAMPLE 6 COMPARISON EXAMPLE 6 | 1.5 | 2.2 | 2.5 | 0.35 | 0.5 | 21 | 0 |
| EXAMPLE 7 COMPARISON EXAMPLE 7 | 1.7 | 2.4 | 2.7 | 0.35 | 0.5 | 37.5 | 0 |
| EXAMPLE 8 COMPARISON EXAMPLE 8 | 0.8 | 1.4 | 1.7 | 0.3 | 0.45 | 84 | 6 |
| EXAMPLE 9 COMPARISON EXAMPLE 9 | 1 | 1.6 | 1.9 | 0.3 | 0.45 | 56 | 6 |

LAND RADIUS : 0.25mm

FIG.12

LAND RADIUS : 0.4mm

CIRCUIT BOARD AND ELECTRONIC EQUIPMENT USING THE SAME

BACKGROUND OF THE INVENTION

1. Field of the Invention

The present invention relates to a circuit board and electronic equipment using the same and particularly, to a circuit board on which insertion-type electrical parts are mounted by using lead-free solder, and electronic equipment using the same.

2. Description of the Related Art

The construction of a conventional board circuit will be described in detail with reference to FIGS. 1 to 6.

Figure 1:
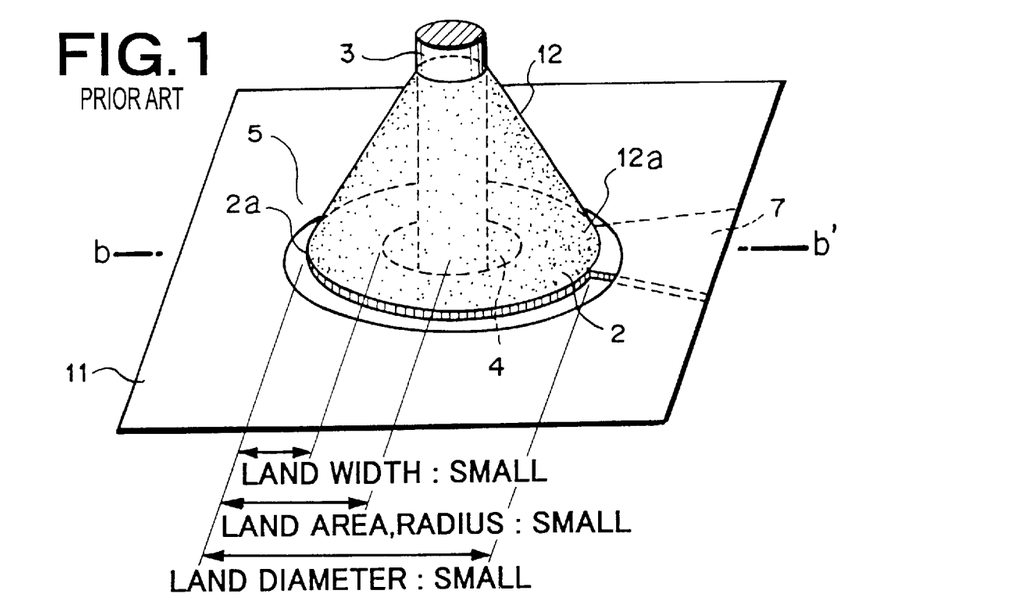
FIG. 1 is a perspective view showing the construction of a conventional circuit board.
Figure 2:
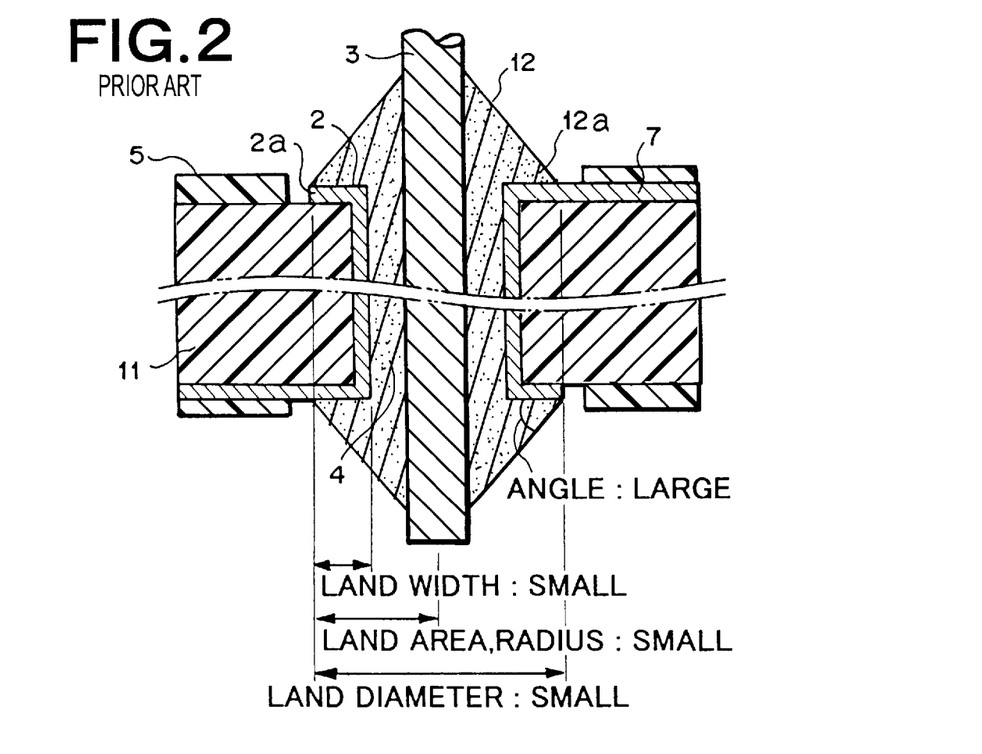
FIG. 2 is a cross-sectional view showing the construction of the conventional circuit board.
Figure 3:
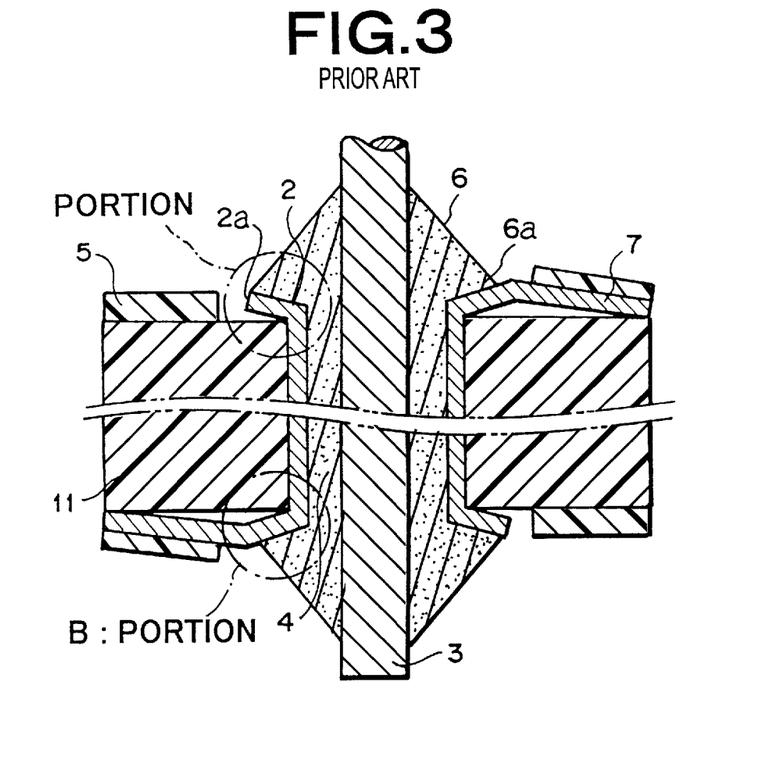
FIG. 3 is a cross-sectional view showing occurrence of a manufacturing failure when the conventional construction is used.
Figure 4:
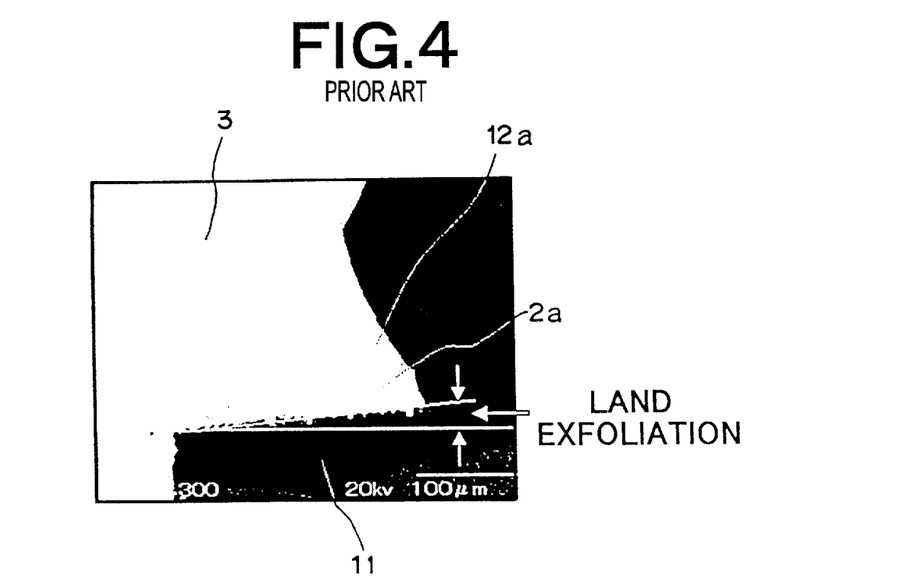
FIG. 4 is a cross-sectional photograph showing occurrence of the manufacturing failure when the conventional construction is used.
Figure 5:
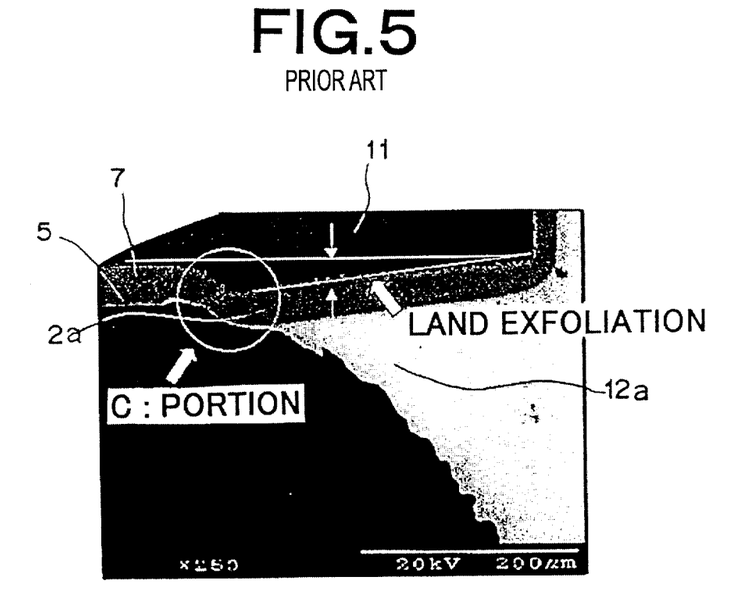
FIG. 5 is a cross-sectional photograph showing occurrence of the manufacturing failure when the conventional construction is used.
Figure 6:
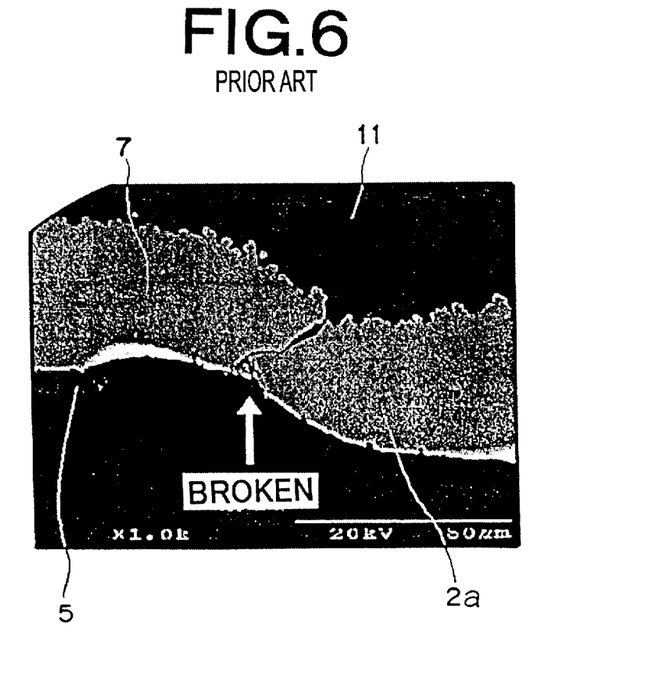
FIG. 6 is a partially enlarged photograph of FIG. 5.

FIG. 1 is a perspective view showing a soldered portion of a circuit board on which electrical parts are mounted by using solder, FIG. 2 is a cross-sectional view taken along a line b–b' of FIG. 1 and FIG. 3 is a cross-sectional view that schematically shows an occurrence state of land exfoliation. FIGS. 4 to 6 are diagrams showing occurrence of land exfoliation confirmed in a verification test, wherein FIG. 4 is a cross-sectional photograph of A portion (right-and-left inversion) of FIG. 3, FIG. 5 is a cross-sectional photograph of B portion of FIG. 3 and FIG. 6 is an enlarged photograph of C portion of FIG. 5.

Conventional circuit board 11 is formed as follows. That is, as shown in FIGS. 1 and 2, a paper base, a glass base, a polyester fiber base or the like is impregnated with epoxy resin, phenol resin or the like to form an insulating sheet, and then copper foil is attached onto the insulating sheet by a pressuring and heating treatment to form a copper-coated laminate board. Thereafter, a through hole is formed at a desired place of the board, catalyst is supplied to the side surface of the through hole, and then electroless copper plating is applied to the side surface supplied with the catalyst to carry out rough plating. Thereafter, copper electroplating is applied onto the roughly-plated side surface of the through hole to form a conductor (conductive film). The conductor thus achieved and the copper film on the copper-coated laminate board are connected to each other to form through hole 4. Thereafter, the conductive film of copper on the copper-coated laminate board is etched to form land 2.

Finally, solder resist 5 is printed and coated onto the board so that tin-lead solder 12 is not coated onto the portion other than the land 2 on which soldering is conducted, and then exposed to light to form circuit board 11. At this time, the solder resist 5 takes a role of protecting circuits 7 other than the land 2 on which lead 3 is mounted.

Here, the solder resist 5 on the circuit board 11 is printed so as to have an area larger than that of the land 2 and thus so that no solder resist 5 is covered on the land 2. This is because formation of fillet 12a of tin-lead solder 12 would be disturbed if the solder resist 5 is covered on the land 2 in the soldering process using tin-lead eutectic solder (Sn of 63 weight %, Pb of the remaining weight %) which is most frequently used in a soldering joint process for electronic equipment.

Following the recent high-density mounting design, the land 2 is designed to be as small as possible within the permissible range that the minimum joint strength can be kept. Electronic equipment manufactured by using such a conventional circuit board 11 has no critical problem in reliability because tin-lead eutectic solder takes a role of stress-relaxing thermal expansion mismatch which is caused by joint of foreign matters.

However, environmental pollution of lead has been recently more remarkable because people pay more attention to the environmental pollution, and thus shift to lead-free solder containing no lead has been promoted. The lead-free solder mainly comprises tin, and also contains silver, copper, zinc, bismuth, indium, antimony, nickel, germanium, etc., and it has metal characteristics that are higher in metal tensile strength and creep strength and also less in extension as compared with tin-lead eutectic solder (Sn of 63 weight % and Pb of the remaining weight %, hereinafter referred to as "Pb-63Sn") which is most frequently used for the solder joint of electronic equipment at present. Therefore, the stress relaxation more hardly occurs at the soldered portion as compared with lead solder. Further, the melting temperature of lead-free solder is equal at 190° C. to 230° C. (190 to 230 degrees Celsius) which is higher than that (183° C.) of tin-lead eutectic solder.

As the lead-free solder are mainly used tin-zinc-based solder (materials that contain a tin-zinc eutectic composition (Sn-9.0 wt % and Znwp) as a main material and are improved in characteristics by varying the amount of zinc or adding other elements are generally referred to as "tin-zinc-based solder", and Sn-8.0Zn-3.0Bi is known as a representative material), tin-copper-based solder (representatively, Sn-0.7Cu-0.3Ag), tin-silver-based solder (representatively, Sn-3.0Ag-0.5Cu) or the like. The tin-zinc-based solder has a merit that the melting point thereof is equal to a low value (about 190° C.), however, it must be soldered under an inactive atmosphere or under vacuum because it is liable to be oxidized, so that the soldering work efficiency is low.

Further, the tin-copper-based solder and the tin-silver-based solder have little problem in oxidation. However, the tin-copper-based solder has a disadvantage that it has a high melting temperature (about 230° C.) and thus land exfoliation is liable to occur.

The tin-silver-based solder has a merit that the melting point thereof is equal to about 220° C. lower than that of the tin-copper-based solder and it can be reduced to about 205° C. by adding Bi (bismuth). The melting point of the tin-silver-based solder is lowered by increasing the addition amount of bismuth, however, the tin-silver-based solder has a disadvantage that fillet exfoliation occurs if the addition amount of bismuth is increased.

The glass transition temperature of epoxy-based material which is the main material of the circuit board is equal at 125° C. to 140° C. When lead-free solder is used, the difference in solidification and shrinkage temperature between the epoxy-based material and lead-free solder is larger than when tin-lead solder is used, so that the stress applied to the joint portion of the lead-free solder is larger. It is apparent from the metal characteristics of the lead-free solder as described above that if insertion mounting is carried out on conventional circuit board 11 by using the lead-free solder 6, the land exfoliation which occurs little in the case of the tin-lead solder 12 occurs frequently.

An occurrence example of the land exfoliation will be described in detail with reference to the accompanying drawings.

As shown in FIG. 3, if soldering using lead-free solder 6 is carried out by using the conventional circuit board 11, a large stress is applied to the land 2 due to the difference in solidification and shrinkage temperature between the board material and the lead-free solder 6, and the land 2 is exfoliated from the circuit board 11, so that the land 2 is kept to be floated from the circuit board 11 (see the A portion of FIG. 3 and FIG. 4). At this time, the circuit 7 connected to the land 2 is together lifted up and drawn with the land 2 and thus suffers excessive stress, so that it can be confirmed that the boundary portion between the land end portion 2a and circuit 7 is greatly deformed and broken (see the B portion of FIG. 3 and FIGS. 5 and 6). That is, it is found that occurrence of land exfoliation causes occurrence of wire breaking of the circuit 7.

The manufacturing of electronic equipment by using the conventional circuit board 11 in which the land exfoliation occurs as described above remarkably lowers reliability to the electronic equipment.

SUMMARY OF THE INVENTION

The present invention has an object to provide a circuit board having high reliability in which neither land exfoliation nor fillet exfoliation occurs even when lead-free solder is used.

Further, the present invention has another object to provide electronic equipment having high reliability by using the above circuit board.

In order to attain the above objects, according to the present invention, there is provided a circuit board having circuit wires on the surface and back surface thereof, comprising lands having through holes through which conductive members of electrical parts are inserted, said through holes being coated with a conductive film on the side surfaces themselves, wherein said lands and conductive members are mounted by using lead-free solder and the width of each land corresponding to the difference between the radius of each land and each through hole is set at 0.40 mm or more.

Further, according to the present invention, there is provided a circuit board having circuit wires on the surface and back surface thereof, comprising lands having through holes through which conductive members of electrical parts are inserted, said through holes being coated with a conductive film on the side surfaces themselves, wherein said lands and conductive members are mounted by using lead-free solder, and the width of each land corresponding to the difference between the radius of each land and each through hole is set such a value that the intimate contact strength of said land is larger than said land exfoliating force.

The circuit board according to the present invention can be applied a circuit board having through holes through which conductive members (for example, leads) of electrical parts are inserted and a conductive film is coated to the side surfaces themselves, that is, a double-sided printed circuit board or a multi-layer printed circuit board.

Further, in the present invention, the lead-free solder preferably contains tin-zinc based solder, tin-silver based solder or tin-copper based solder.

Furthermore, in the present invention, there is provided electronic equipment in which electrical parts are inserted and mounted in the circuit board by using the lead-free solder.

Still furthermore, in the present invention, the lead-free solder contains solder that contains lead as impurities to the order of no occurrence of property-change.

As described above, the melting point of the lead-free solder is higher than that of lead-containing solder, and consequently, the stress-relaxing force of the lead-free solder is low, whereby the land exfoliation occurs frequently. According to the present invention, in the circuit board in which the lands to be soldered are formed around the through holes in which the leads of the electrical parts are inserted and mounted, the difference in radius between each land and each through hole (the width of each land) is set at a predetermined value or more, whereby each land and the circuit board can be attached to each other with large force, so that the exfoliation of the lands can be prevented and electronic equipment having sufficiently high reliability can be manufactured even when the lead-free solder is used.

DETAILED DESCRIPTION OF THE PREFERRED EMBODIMENTS

Preferred embodiments according to the present invention will be described hereunder with reference to the accompanying drawings.

Figure 7:
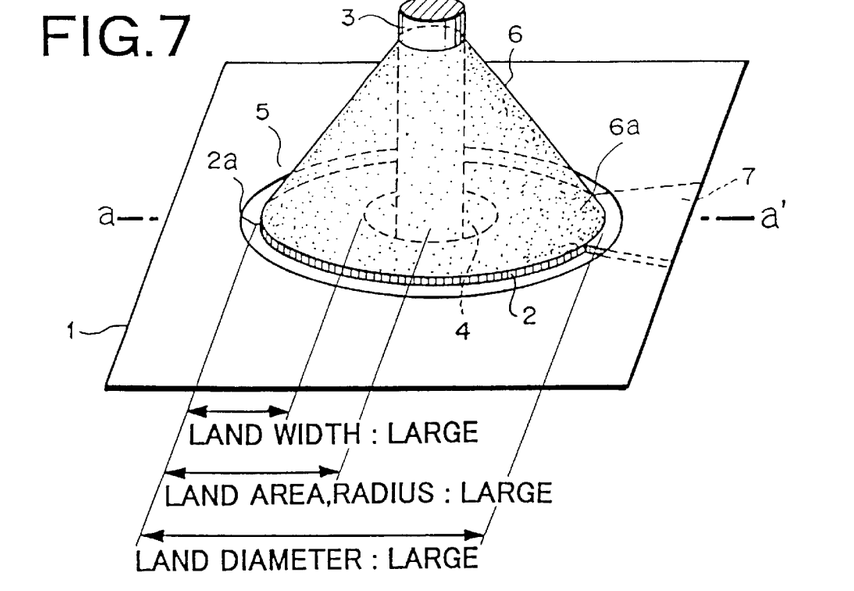
FIG. 7 is a perspective view showing an embodiment of a circuit board according to the present invention.

According to the present invention, as shown in FIG. 7, circuit board 1 is equipped with land 2 having through hole 4 through which lead 3 of an electrical part is inserted, and the lead 3 and the land 2 are mounted in the circuit board 1 by using lead-free solder 6, wherein the land 2 is designed so that the difference in radius between the land 2 and the through hole 4 (the width of the land 2) is set to about 0.40 mm (millimeter) or more. With this design, the land 2 and the circuit board 1 are brought into intimate contact with each other by the force larger than the land exfoliating force based on the solidification/shrinkage force of the lead-free solder 6 and the shrinkage force of the circuit board 1, or tensile force directing in the upper oblique direction along solder fillet 6a that occurs when the lead-free solder 6 shrinks is more inclined with respect to the normal direction of the board, thereby reducing the force acting in the normal direction of the board and thus preventing exfoliation of the land 2.

[Embodiments]

Preferred embodiments according to the present invention will be described in detail with reference to FIGS. 7 to 15.

Figure 8:
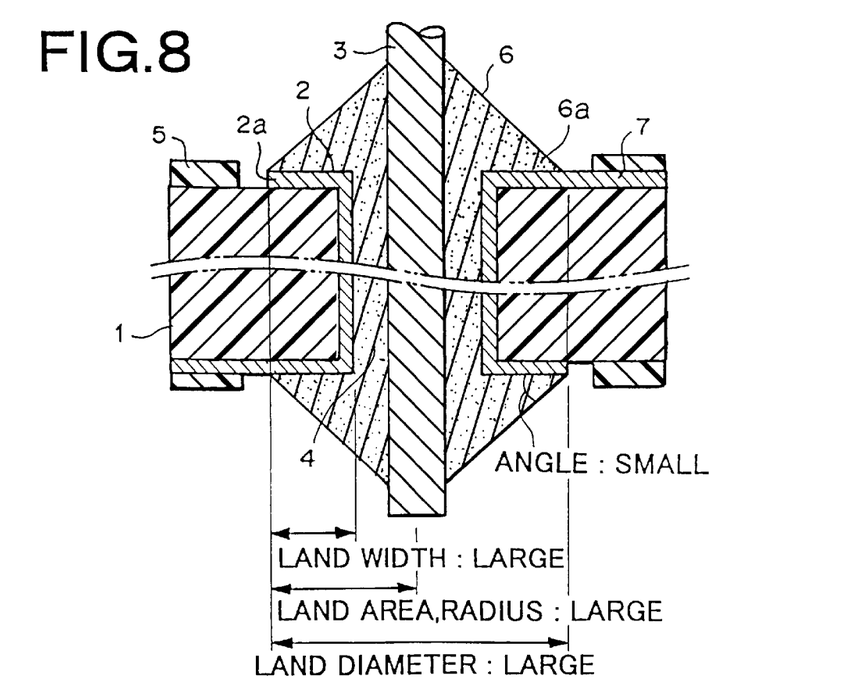
FIG. 8 is a cross-sectional view showing the embodiment of the circuit board according to the present invention.

FIG. 7 is a perspective view showing the state that electrical parts are mounted on the circuit board of an embodiment of the present invention, and FIG. 8 is a cross-sectional view taken along a line a–a' of FIG. 7.

The circuit board 1 of the embodiment is formed in the same manner as the related art. That is, a paper base, a glass base, a polyester fiber base or the like is impregnated with epoxy resin, phenol resin or the like to form an insulating sheet, and then copper foil is attached onto the insulating sheet by a pressuring and heating treatment to form a copper-coated laminate board. Thereafter, a through hole through which lead (or conductive member) 3 of an electrical part is inserted is formed at a desired place of the board, catalyst is supplied to the side surface of the through hole, and then electroless copper plating is applied to the side surface supplied with the catalyst to carry out rough plating. Thereafter, copper electroplating is applied onto the roughly-plated side surface of the through hole to form a conductor (conductive film). The conductor thus achieved and the copper film on the copper-coated laminate board are connected to each other to form through hole 4.

Thereafter, the conductive film of copper on the copper-coated laminate board is etched to form land 2. According to this embodiment, at this time, since the etching area is set so that the difference in radius between the land 2 and the through hole 4 (i.e., the width of the land 2) is equal to a predetermined value or more, the intimate attachment between the copper-coated laminate board and the conductive film of copper or the like is enhanced. Thereafter, solder resist 5 is printed and coated onto the board so that the lead-free solder 6 is not attached to portions other than the land 2 to be soldered, and then exposed to light to form the circuit board 1. At this time, the solder resist 5 takes a role of protecting circuits 7 other than the land 2 on which lead 3 is mounted.

This embodiment proposes a construction of preventing the land exfoliation when lead-free solder is used and also enabling the direct application thereof to tin-lead eutectic solder.

The present invention is based on the technical idea as previously written in the paper (MES2000 (the Tenth Microelectronics symposium) in November 2000, pp207–210) by the inventors of this application, and the present invention is realized on the basis of the knowledge achieved by an experiment result that the land exfoliation can be suppressed if the difference in radius between the land and the through hole (the width of the land) is equal to a predetermined value or more.

According to this embodiment, circuit boards 1 having various combinations of the diameter of the through hole 4 and the diameter of the land 2 are prepared, and electrical parts are mounted on these circuit boards 1 by using tin-silver based lead-free solder of Sn-3.0Ag-0.5Cu to examine the incidence of the land exfoliation. Glass fabric epoxy circuit boards (FR-4) are used as the circuit boards 1. FR-4 is defined with the standards (standard number: PUB, LI-1 sec, 8) of NEMA (National Electrical Manufactures Association). Further, FR-4 is defined with the standards (standard number: D-1867) of ASTM (American Society for Testing and Materials). Here, the judgment as to whether the land exfoliation occurs or not is carried out by observing the soldered portion from the slant direction of 45 degrees with a microscope, and at least a part exfoliation of the periphery of the land 2 is counted as a land-exfoliated one.

Figure 9:
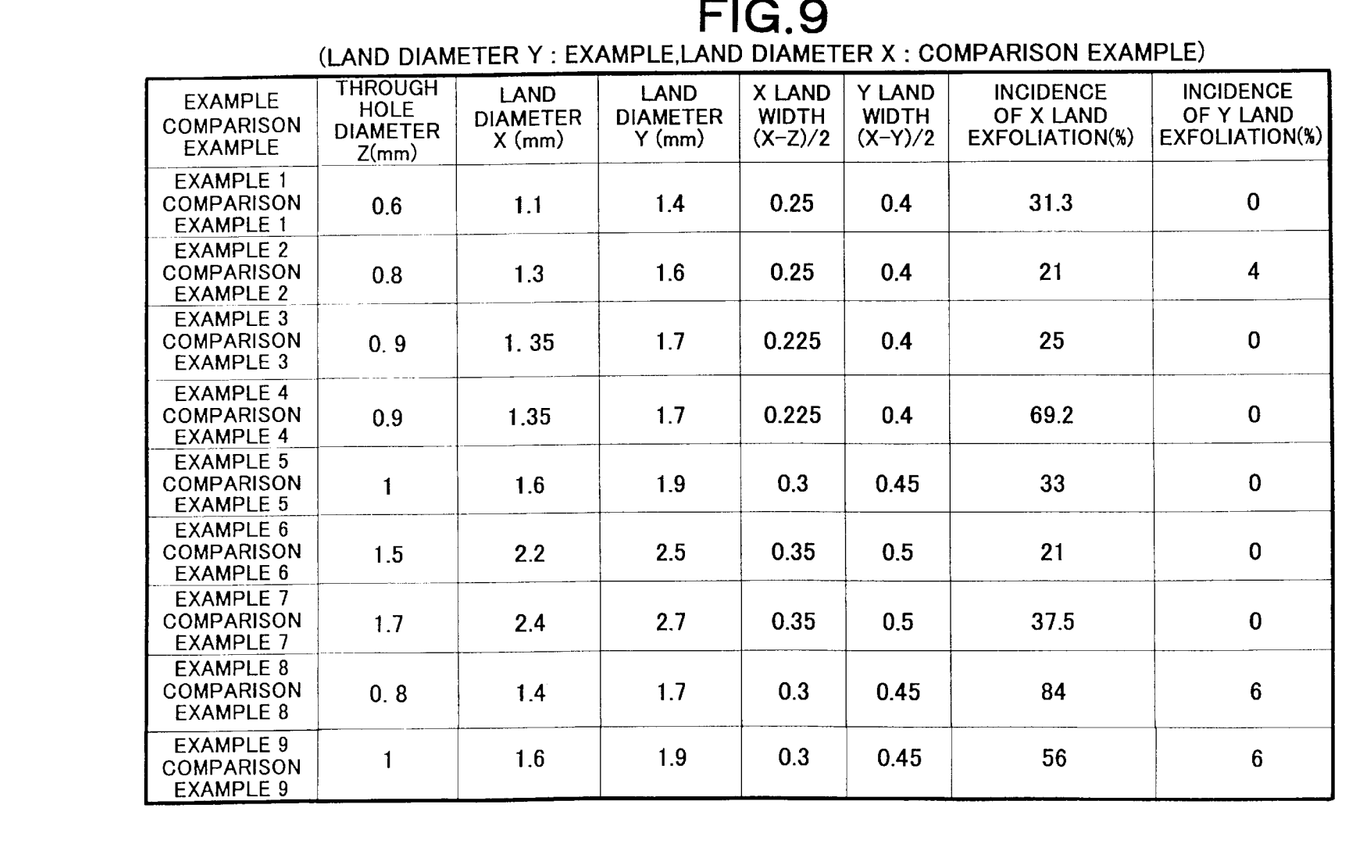
FIG. 9 is a diagram showing the result of the examination of the incidence of the land exfoliation.

FIG. 9 is a diagram showing the result of the examination of the incidence of the land exfoliation when combination condition between the diameter of each through hole 4 (through hole diameter Z) and the diameter of each land 2 (land diameter Y of examples 1 to 9 and land diameter X of comparison examples 1 to 9) is change each land width ((Y-Z)/2 ) of examples 1 to 9 is the land width according the present invention. On the other hand, each land width ((X-Z)/2 ) of comparison examples 1 to 9 is not the land width according the present invention. The land width ((X-Z)/2 or (Y-Z)/2 ) corresponds to the difference between the land radius (X/2 or Y/2) and the through hole radius (Z/2). The electric parts used in the examples 1 to 7 are connectors, and the electric parts used in the examples 8 and 9 are DIP-ICs (Dual In-line Package Integrated Circuits). The electric parts used in the comparison examples 1 to 7, 8 and 9 are respectively the same electric parts (or connectors and DIP-ICs) as the electric parts used in the examples 1 to 7, 8 and 9. The difference between the examples 1 to 9 and the comparison examples 1 to 9 is that the land diameter is changed. The same examinations are carried out in the examples 1 to 9 and comparison examples 1 to 9.

In FIG. 9, as is apparent from the incidence of the land exfoliation to the land width ((X-Z)/2 or (Y-Z)/2 ), the incidence of the land exfoliation decrease as a whole as the diameter of the land 2 is increased. Particularly, the incidence of the land exfoliation is reduced to 10% or less when the width of the land 2 is equal to 0.40 mm or more (data of (Y-Z)/2 )), and thus the incidence of the land exfoliation can be reduced to the level in that no problem occurs in reliability.

As described above, when the width of the land 2 is large, the intimate contact area of the land 2 is increased, so that the intimate contact strength of the land 2 (copper foil) is larger than the land exfoliating force. Further, the force acting in the normal direction of the board is reduced by more inclining, with respect to the normal direction of the board, the tensile force directing in the upper oblique direction along the solder fillet 6a when the lead-free solder 6 shrinks. With the above effects, the land exfoliation can be suppressed.

From the data of FIG. 9, it is preferable as the value bringing the above effects that the difference in radius between the land 2 and the through hole 4 (i.e., the width of the land 2) is equal to 0.40 mm or more. Accordingly, if the land 2 is formed so that the above condition is satisfied, the land exfoliation could be prevented.

Figures 10A, 10B:
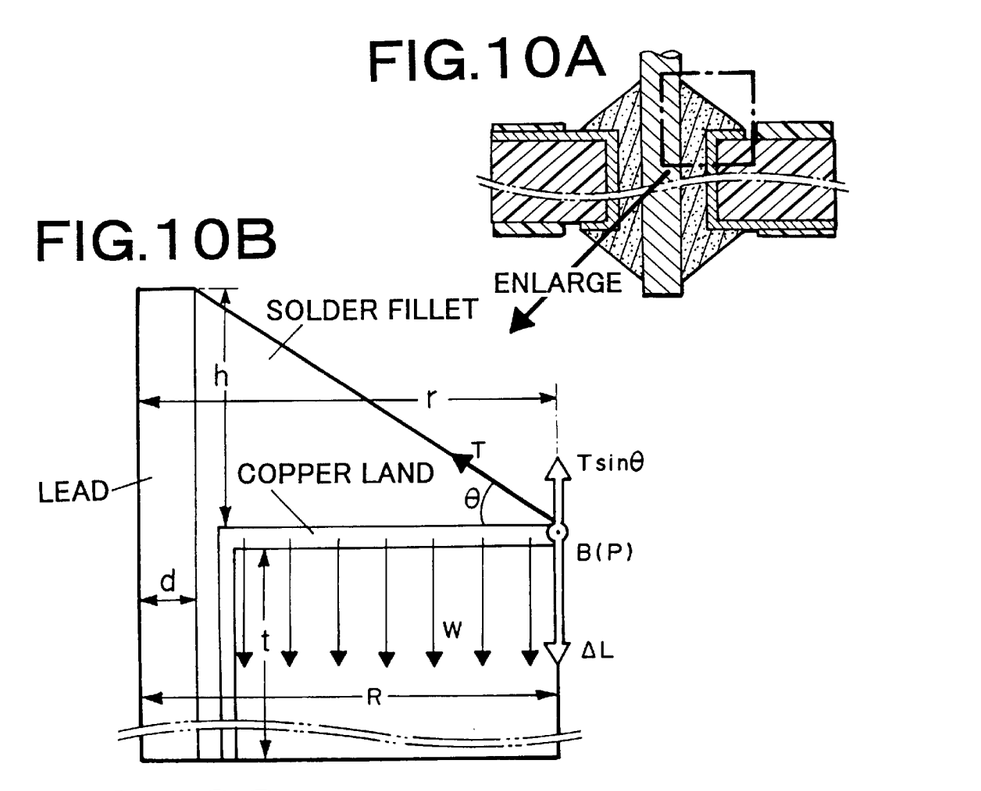
FIGS. 10A to 10C are explanatory diagrams to explain the principle for preventing the exfoliation of the land.
Figure 10C:
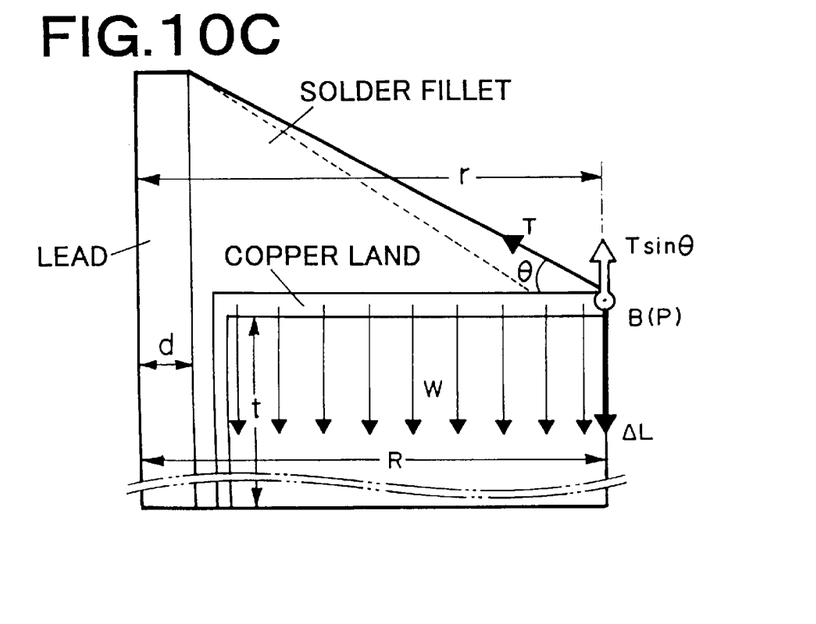

FIGS. 10A to 10C are explanatory diagrams to explain the principle for preventing the exfoliation of the land.

As shown in FIGS. 10A to 10C, the land exfoliation occurs due to force T·sin θ and force ΔL acted to the normal direction of the board at point B of the land end portion. Accordingly, the force T·sin θ and the force ΔL should be decreased more small to prevent the land exfoliation.

The force T of the force T·sin θ is shrinkage force of the solder, and the force T is in proportion to (⅓)πr²·h. Here, the angle θ is between the upper oblique direction along the solder fillet and the parallel direction to the surface of the board, the radius r is the radius of the solder fillet and the height h is the height of the solder fillet. Therefore, the fillet radius r and the angle θ should be made more small to decrease the force T·sin θ.

On the other hand, the force ΔL is in proportion to W·π(R²−d²) and the shrinkage force W is in proportion to α·t. Here, the radius R is the radius of the land, the radius d is the radius of the lead of an electric part, the shrinkage force W is the shrinkage force of the board, the coefficient α is the thermal expansion coefficient of the board and the thickness t is the thickness of the board. Therefore, the coefficient α and the land radius R should be made more small to decrease the force ΔL.

If the land radius R becomes large, the angle θ becomes small. Therefore, the land radius R should be made more large to decrease the force T·sin θ and the force ΔL.

Consequently, the land radius R sets up as the land exfoliating force is smaller than the intimate contact strength of the land, and thereby the land exfoliation can be prevented.

Figure 11:
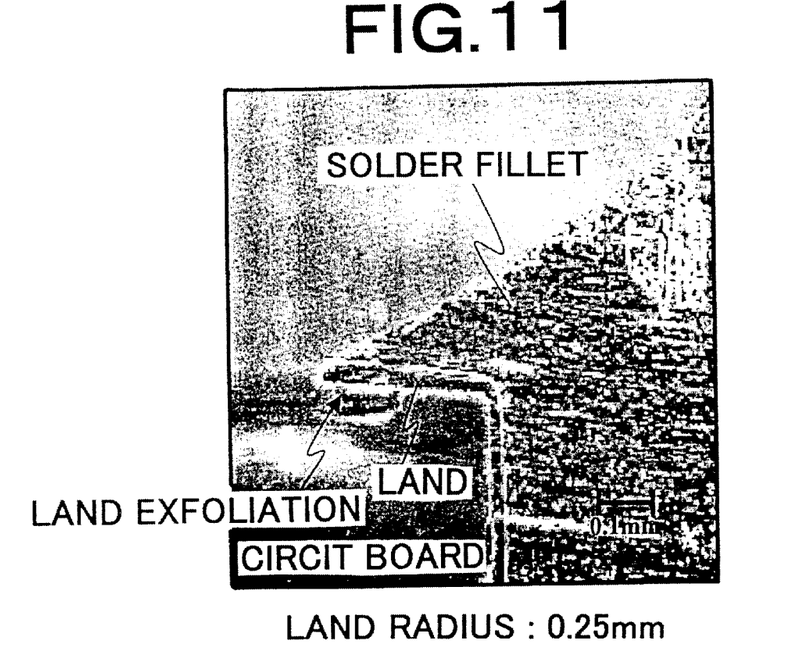
FIG. 11 is a cross-sectional photograph showing the state of the land exfoliation which occurs due to the small size of the land radius.
Figure 12:
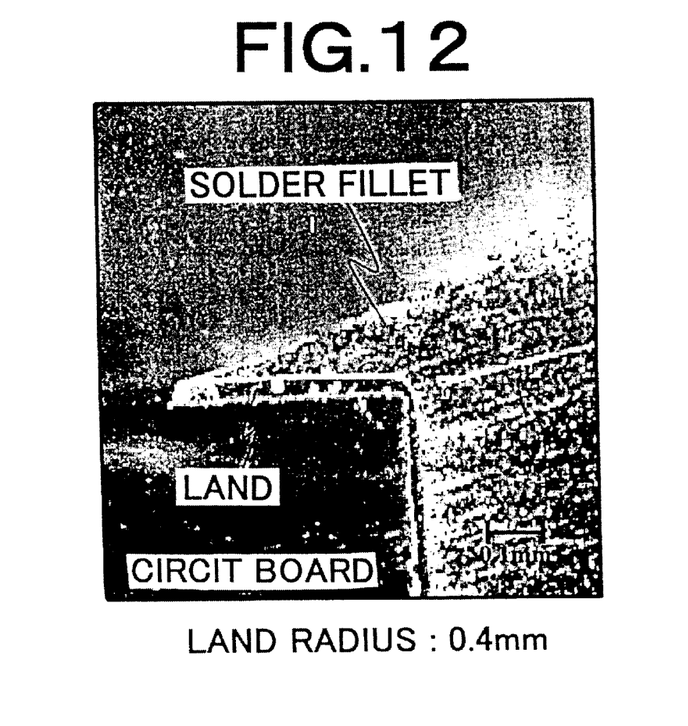
FIG. 12 is a cross-sectional photograph showing the state that it made the land radius to large size to prevent the land exfoliation.
Figure 13:
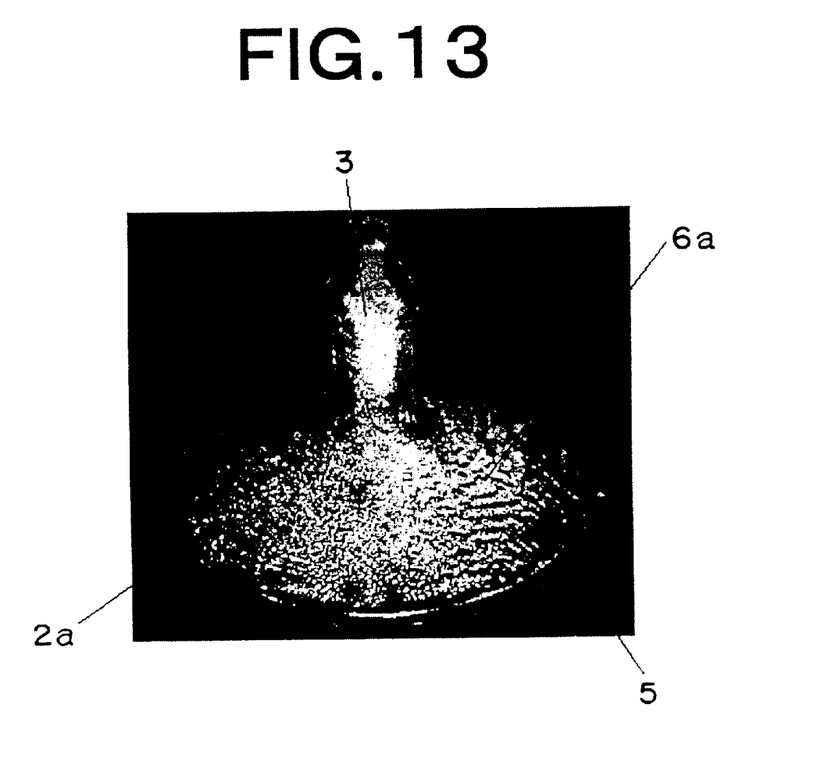
FIG. 13 is a perspective photograph showing the state that angle θ is very small in the end portion of the land because of the wet-expansion of the lead-free solder.

FIG. 11 is a cross-sectional photograph showing the state of the land exfoliation which occurs due to the small size of the land radius. FIG. 12 is a cross-sectional photograph showing the state that it made the land radius to large size to prevent the land exfoliation. FIG. 13 is a perspective photograph showing the state that angle θ is very small in the end portion of the land because of the wet-expansion of the lead-free solder.

Next, another embodiment of the present invention for further suppressing the land exfoliation will be described.

Figure 14:
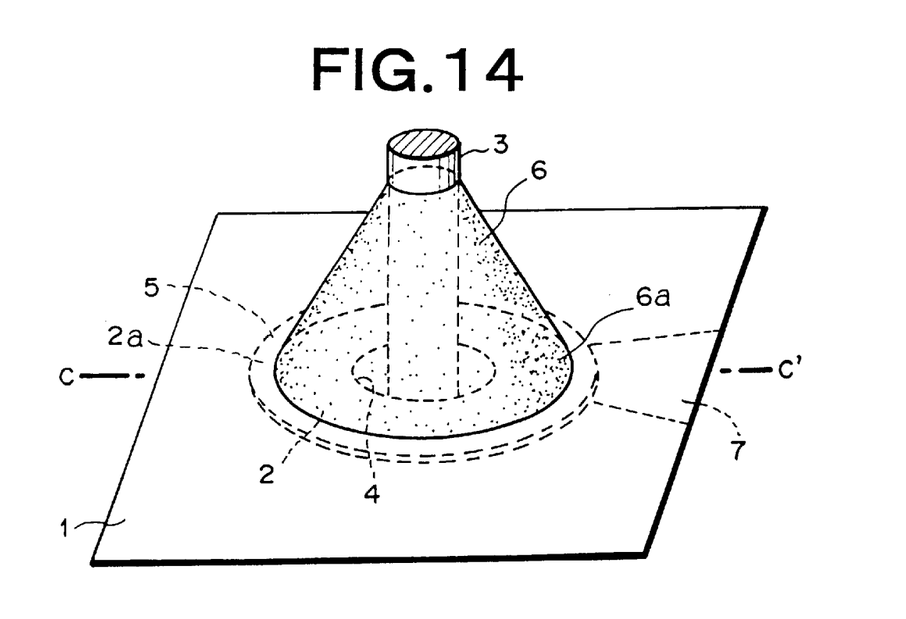
FIG. 14 is a perspective view showing another embodiment of the circuit board according to the present invention.
Figure 15:
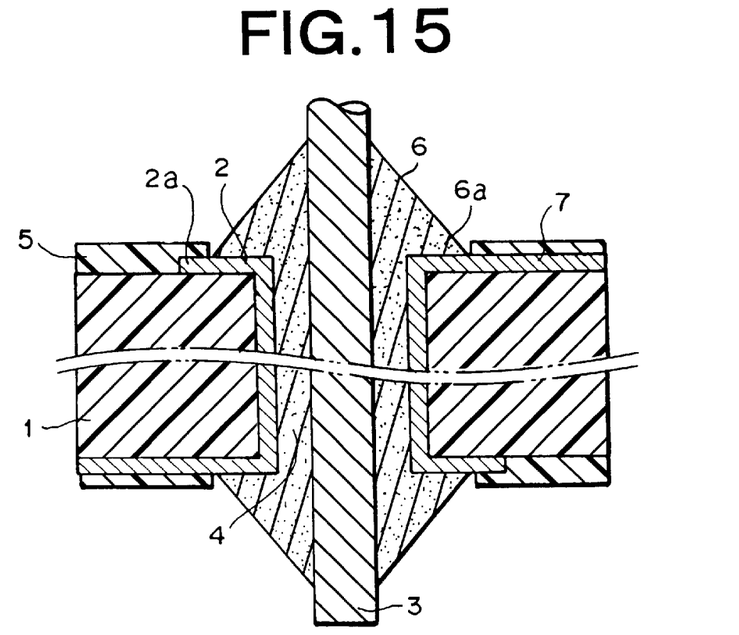
FIG. 15 is a cross-sectional view showing another embodiment of the circuit board according to the present invention.

This construction is characterized by the area on which the solder resist 5 is formed. Specifically, as shown in FIGS. 14 and 15, the aperture area of the solder resist 5 is set to be smaller than the total area of the through hole 4 and the land 2, and the solder resist 5 is coated on the land end portion 2a.

With the above construction, the solder fillet 6a is formed so as to be nearer to the center of the through hole than the land end portion 2a, so that the repulsive force to the thermal shrinkage of the circuit board 1, which occurs on the basis of the relationship between the fillet forming angle and the tension directing in the upper and slanting direction along the solder fillet 6a when the lead-free solder 6 shrinks, is not applied to the land end portion 2a which is most weakly in close contact with the circuit board 1, but to the inside of the land 2 which is more strongly in close contact with the circuit board 1 to thereby suppress the land exfoliation which frequently occurs in the case of lead-free solder 6.

According to the above construction, the land exfoliation when lead-free solder 6 is used can be prevented by using a simple structure that an overlap area between at least a part of the land end portion 2a and the solder resist 5 is provided, and thus this method is excellent in the mounting process using lead-free solder 6. The above construction is excellent as the mount technique when lead-free solder 6 is used. By combining the above construction and the construction that the width of the land is equal to 0.40 mm or more, and the land exfoliation can be further prevented.

The land having the land width which is equal to 0.40 mm or more is applied to each land in the high density mounting circuit board and concretely, suitably to each land of plural lands which are arranged with 1 to 5 mm pitch.

Each electronic part to be mounted on the board by using each land having the land width which is equal to 0.40 mm or more is, for example, a electronic part that has one or more conductive member lines which each line has two or more conductive members (for example, leads) arranged to make a line. Such electronic part is for example, a IC, a IC socket or a connector. If the land exfoliation occurs when the electronic part such as a IC, a IC socket or a connector is mounted on the board, it is difficult to find the land exfoliation because of large number of conductive members. Particularly, when a IC socket is mounted on the board, it is further difficult to find the land exfoliation because the land is placed just under the IC socket. Consequently, the electronic part preferably used in the present invention is the electronic part such as a IC, a IC socket or a connector.

Further, if electronic equipment is manufactured by using the above-described circuit board, electronic equipment having high resistance to repetitive thermal stress cycle, a long lifetime and high reliability can be manufactured. Such electronic equipment is, for example, printer, facsimile, LCD monitor, personal computer, large scale computer, exchanger, transmitter or base station apparatus. In the large scale computer, it contains saver or super computer.

The present invention is not limited to the above-described embodiments, and various alterations or modifications may be suitably made without departing from the subject matter of the present invention.

As described above, according to the present invention, in the circuit board in which through holes through which the leads of the electrical parts are mounted are formed on the surface of the circuit board and the surfaces of the through holes are plated to be joined to the lands on the surface of the circuit board, thereby forming through holes, the width of each land is set to a predetermined value or more, thereby preventing the land exfoliation which frequently occurs in the case of lead-free solder.

This is because the intimate contact strength of the lands can be enhanced by increasing the contact area between each land and the circuit board, and the force acting in the normal direction of the board can be reduced by more inclining, with respect to the normal direction of the board, the tensile force in the upper slant direction along the solder fillet when the lead-free solder shrinks.

Further, by manufacturing electronic equipment with the above-described circuit board, the electronic equipment having high resistance to a repetitive thermal stress cycle, a high lifetime and high reliability can be manufactured.

What is claimed is:

1. A circuit board having circuit wires on the surface and back surface thereof, comprising lands having through holes through which conductive members of electrical parts are inserted, said through holes being coated with a conductive film on the side surfaces themselves, wherein said lands and said conductive members are connected by using lead-free solder and the width of each land corresponding to the difference between the radius of each land and each through hole is set at 0.40 mm or more.

2. The circuit board as claimed in claim 1, wherein each fillet of the lead-free solder is formed on each land and between each land and each conductive member.

3. The circuit board as claimed in claim 1, wherein the lead-free solder contains tin-zinc based solder, tin-silver based solder or tin copper based solder.

4. The circuit board as claimed in claim 1, wherein said lends are arranged with 1 to 5 mm pitch.

5. The circuit board as claimed in claim 1, wherein each of said electronic parts has one or more conductive member lines in which each line has two or mare conductive members arranged to make a line.

6. The circuit board as claimed in claim 5, wherein said each electronic part is a IC, a IC socket or a connector.

7. Electronic equipment, in which electrical parts are inserted to and mounted on said circuit board of claim 1 by using the lead-free molder.

\* \* \* \* \*